United States Patent
Elbadry et al.

(10) Patent No.: US 10,291,242 B1
(45) Date of Patent: May 14, 2019

(54) LOCAL OSCILLATOR (LO) PHASE CONTINUITY

(71) Applicant: QUALCOMM Incorporated, San Diego, CA (US)

(72) Inventors: Mohammad Elbadry, San Diego, CA (US); Marco Zanuso, Encinitas, CA (US); Tsai-Pi Hung, San Diego, CA (US); Francesco Gatta, San Diego, CA (US); Yunliang Zhu, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/993,254

(22) Filed: May 30, 2018

(51) Int. Cl.
    *H03L 7/00* (2006.01)
    *H04B 1/04* (2006.01)
    *H03L 7/099* (2006.01)
    *H03L 7/085* (2006.01)
    *H04L 7/033* (2006.01)

(52) U.S. Cl.
    CPC .............. *H03L 7/099* (2013.01); *H03L 7/085* (2013.01); *H04L 7/0331* (2013.01)

(58) Field of Classification Search
    CPC ........ H03L 7/099; H03L 7/085; H04L 7/0331
    See application file for complete search history.

(56) References Cited

U.S. PATENT DOCUMENTS

| | | | | |
|---|---|---|---|---|
| 5,579,184 | A | * 11/1996 | Nakanishi | G11B 20/1403 327/156 |
| 6,018,275 | A | * 1/2000 | Perrett | H03C 3/095 331/23 |
| 6,438,177 | B1 | * 8/2002 | Ikeda | H04L 27/2332 375/316 |
| 6,542,038 | B2 | * 4/2003 | Nishimura | H03L 7/081 331/1 A |
| 6,754,147 | B2 | 6/2004 | Hsu et al. | |
| 8,258,878 | B2 | * 9/2012 | Yen | H03C 3/0916 331/10 |
| 9,106,234 | B2 | 8/2015 | Zhu et al. | |
| 9,276,622 | B2 | * 3/2016 | Liu | H04B 1/16 |
| 9,762,284 | B2 | * 9/2017 | Alavi | H04B 1/525 |
| 9,893,875 | B2 | 2/2018 | Zanuso et al. | |
| 2016/0204909 | A1 | 7/2016 | Kushnir et al. | |
| 2017/0012584 | A1 | 1/2017 | Lee et al. | |
| 2017/0215039 | A1 | 7/2017 | Amizur et al. | |

* cited by examiner

*Primary Examiner* — Kenneth B Wells
(74) *Attorney, Agent, or Firm* — Patterson & Sheridan, LLP

(57) ABSTRACT

Certain aspects of the present disclosure generally relate to techniques and circuits for phase correction, or at least adjustment, of multiple local-oscillator (LO) signals. For example, certain aspects provide an apparatus for phase adjustment. The apparatus generally includes a phase-locked loop (PLL), at least one frequency divider coupled to an output of the PLL, the at least one first frequency divider being external to the PLL, a phase adjustment circuit having an input coupled to an output of the frequency divider, and at least one mixer having an input coupled to at least one output of the phase adjustment circuit.

27 Claims, 10 Drawing Sheets

LOCAL OSCILLATOR (LO) PHASE CONTINUITY

TECHNICAL FIELD

Certain aspects of the present disclosure generally relate to electronic circuits and, more particularly, to radio frequency (RF) front-end circuitry.

BACKGROUND

A wireless communication network may include a number of base stations that can support communication for a number of mobile stations. A mobile station (MS) may communicate with a base station (BS) via a downlink and an uplink. The downlink (or forward link) refers to the communication link from the base station to the mobile station, and the uplink (or reverse link) refers to the communication link from the mobile station to the base station. A base station may transmit data and control information on the downlink to a mobile station and/or may receive data and control information on the uplink from the mobile station. The base station and/or mobile station may include radio frequency (RF) front-end circuitry. The RF front-end circuitry may include one or more phase-locked loops (PLLs) for generating local oscillator (LO) signals to be used for upconversion and downconversion of RF signals.

SUMMARY

Certain aspects of the present disclosure generally relate to techniques and circuits for phase correction of multiple local-oscillator (LO) signals.

Certain aspects of the present disclosure provide an apparatus for phase adjustment. The apparatus generally includes a phase-locked loop (PLL), at least one first frequency divider coupled to an output of the PLL, the at least one first frequency divider being external to the PLL, a phase adjustment circuit having an input coupled to an output of the first frequency divider, and at least one mixer having an input coupled to at least one output of the phase adjustment circuit.

Certain aspects of the present disclosure provide a method for phase adjustment. The method generally includes frequency dividing a first oscillating signal to generate a first frequency-divided signal, frequency dividing the first oscillating signal to generate a phase-locked loop (PLL) feedback signal, wherein the first oscillating signal is generated based on the PLL feedback signal; detecting a phase error associated with at least one LO signal, and adjusting a phase of the first frequency-divided signal based on the phase error to generate the at least one LO signal.

Certain aspects of the present disclosure provide an apparatus for phase adjustment. The apparatus generally includes means for frequency dividing a first oscillating signal to generate a first frequency-divided signal, means for frequency dividing the oscillating signal to generate a phase-locked loop (PLL) feedback signal, wherein the oscillating signal is generated based on the PLL feedback signal; means for detecting a phase error associated with at least one LO signal, and means for adjusting a phase of the first frequency-divided signal based on the phase error to generate the at least one LO signal.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein, one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

An Example Wireless System

Figure 1:
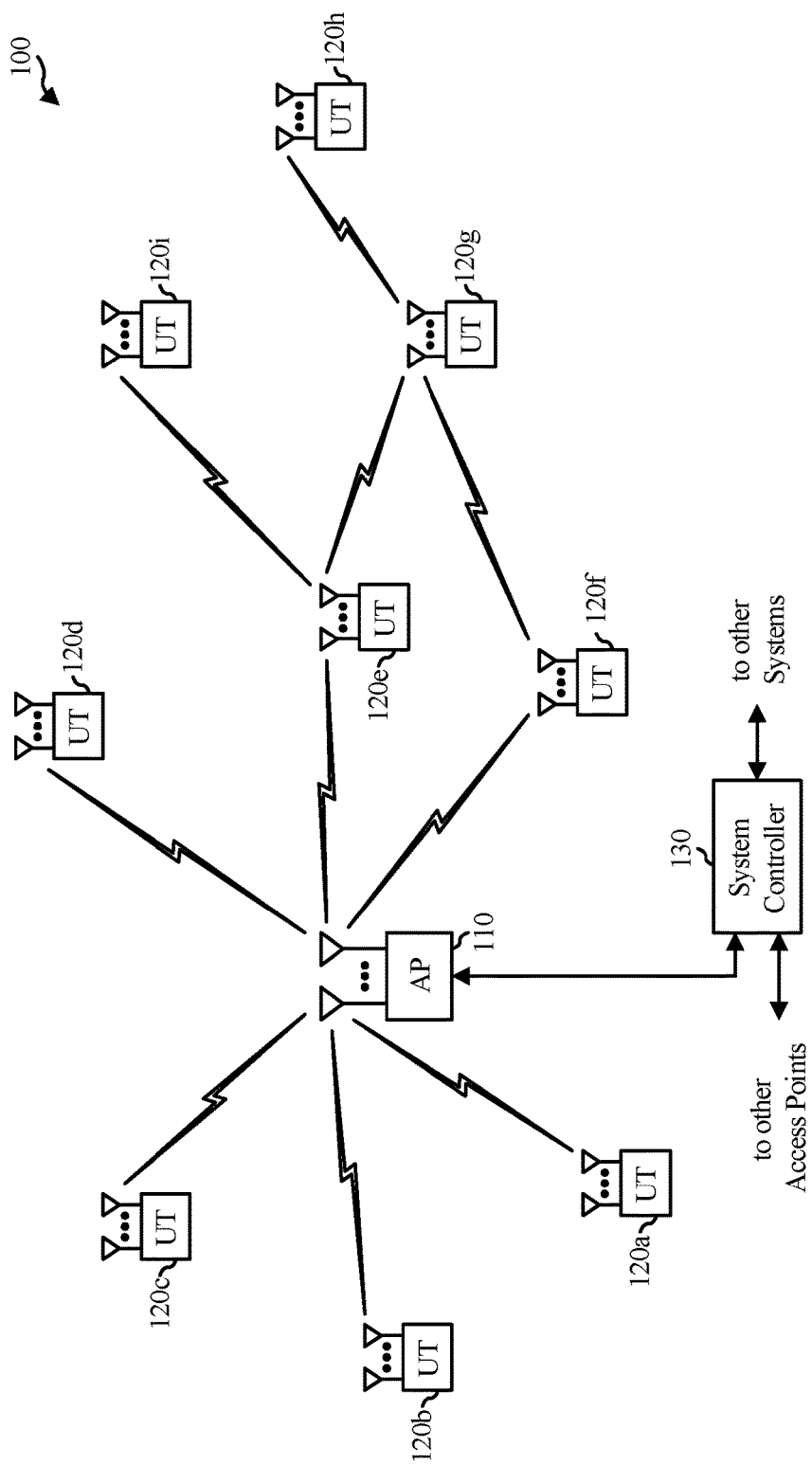
FIG. 1 is a diagram of an example wireless communications network, in accordance with certain aspects of the present disclosure.

FIG. 1 illustrates a wireless communications system 100 with access points 110 and user terminals 120, in which aspects of the present disclosure may be practiced. For simplicity, only one access point 110 is shown in FIG. 1. An access point (AP) is generally a fixed station that communicates with the user terminals and may also be referred to as a base station (BS), an evolved Node B (eNB), or some other terminology. A user terminal (UT) may be fixed or mobile and may also be referred to as a mobile station (MS), an access terminal, user equipment (UE), a station (STA), a client, a wireless device, or some other terminology. A user terminal may be a wireless device, such as a cellular phone, a personal digital assistant (PDA), a handheld device, a wireless modem, a laptop computer, a tablet, a personal computer, etc.

Access point 110 may communicate with one or more user terminals 120 at any given moment on the downlink and uplink. The downlink (i.e., forward link) is the communication link from the access point to the user terminals, and the uplink (i.e., reverse link) is the communication link from the user terminals to the access point. A user terminal may also communicate peer-to-peer with another user terminal. A system controller 130 couples to and provides coordination and control for the access points.

Wireless communications system 100 employs multiple transmit and multiple receive antennas for data transmission on the downlink and uplink. Access point 110 may be equipped with a number $N_{ap}$ of antennas to achieve transmit diversity for downlink transmissions and/or receive diversity for uplink transmissions. A set $N_u$ of selected user terminals 120 may receive downlink transmissions and transmit uplink transmissions. Each selected user terminal transmits user-specific data to and/or receives user-specific data from the access point. In general, each selected user terminal may be equipped with one or multiple antennas (i.e., $N_{ut} \geq 1$). The $N_u$ selected user terminals can have the same or different number of antennas.

Wireless communications system 100 may be a time division duplex (TDD) system or a frequency division duplex (FDD) system. For a TDD system, the downlink and uplink share the same frequency band. For an FDD system, the downlink and uplink use different frequency bands. Wireless communications system 100 may also utilize a single carrier or multiple carriers for transmission. Each user terminal 120 may be equipped with a single antenna (e.g., to keep costs down) or multiple antennas (e.g., where the additional cost can be supported). In certain aspects of the present disclosure, the access point 110 and/or user terminal 120 may include a phase-locked loop (PLL) for generating multiple local oscillator (LO) signals, as described in more detail herein.

Figure 2:
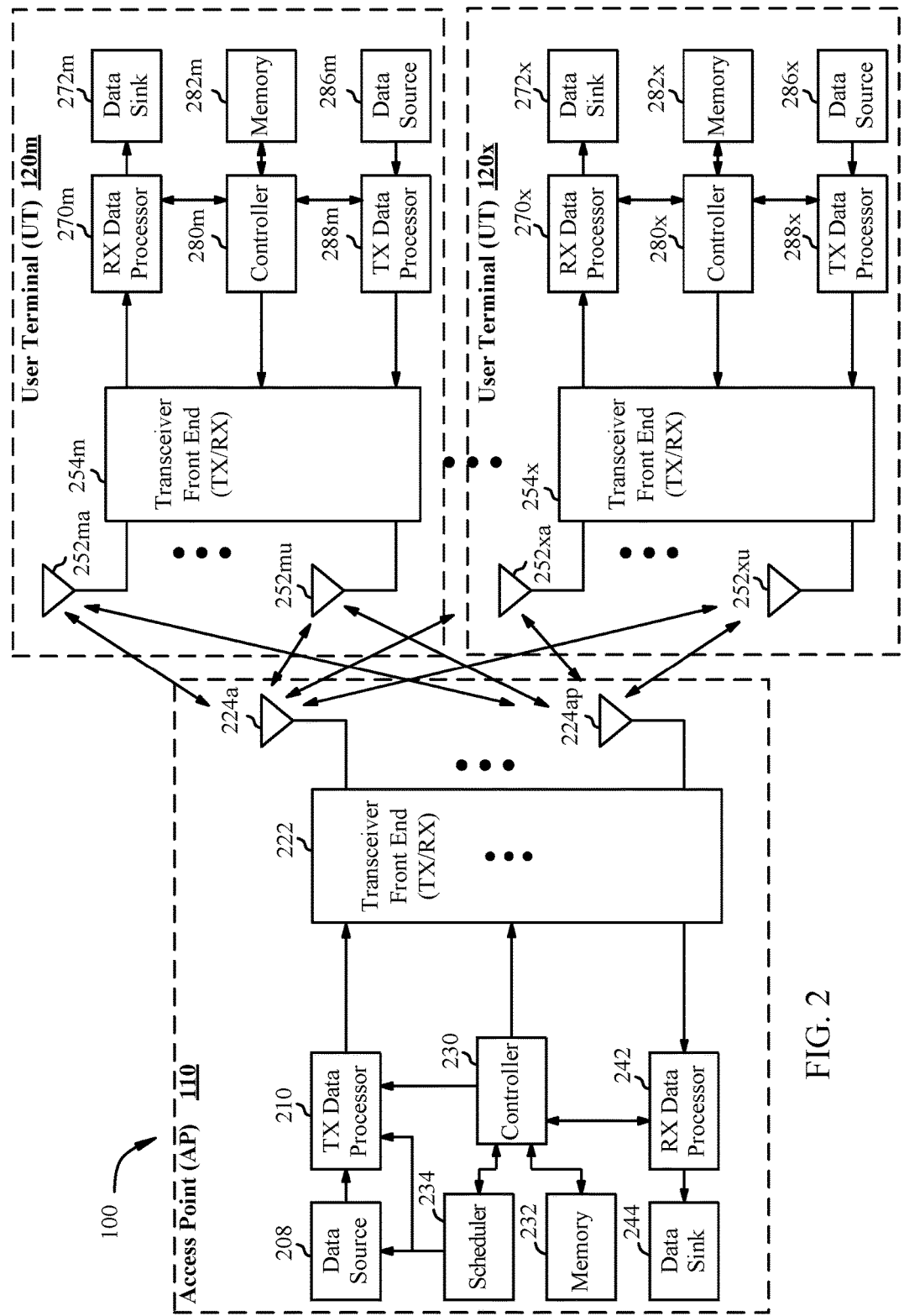
FIG. 2 is a block diagram of an example access point (AP) and example user terminals, in accordance with certain aspects of the present disclosure.

FIG. 2 shows a block diagram of access point 110 and two user terminals 120m and 120x in the wireless communications system 100. Access point 110 is equipped with $N_{ap}$ antennas 224a through 224ap. User terminal 120m is equipped with $N_{ut,m}$ antennas 252ma through 252mu, and user terminal 120x is equipped with $N_{ut,x}$ antennas 252xa through 252xu. Access point 110 is a transmitting entity for the downlink and a receiving entity for the uplink. Each user terminal 120 is a transmitting entity for the uplink and a receiving entity for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink, $N_{up}$ user terminals are selected for simultaneous transmission on the uplink, $N_{dn}$ user terminals are selected for simultaneous transmission on the downlink, $N_{up}$ may or may not be equal to $N_{dn}$, and $N_{up}$ and $N_{dn}$ may be static values or can change for each scheduling interval. Beam-steering or some other spatial processing technique may be used at the access point and user terminal.

On the uplink, at each user terminal 120 selected for uplink transmission, a TX data processor 288 receives traffic data from a data source 286 and control data from a controller 280. TX data processor 288 processes (e.g., encodes, interleaves, and modulates) the traffic data $\{d_{up}\}$ for the user terminal based on the coding and modulation schemes associated with the rate selected for the user terminal and provides a data symbol stream $\{s_{up}\}$ for one of the $N_{ut,m}$ antennas. A transceiver front end (TX/RX) 254 (also known as a radio frequency front end (RFFE)) receives and processes (e.g., converts to analog, amplifies, filters, and frequency upconverts) a respective symbol stream to generate an uplink signal. The transceiver front end 254 may also route the uplink signal to one of the $N_{ut,m}$ antennas for transmit diversity via an RF switch, for example. The controller 280 may control the routing within the transceiver front end 254. Memory 282 may store data and program codes for the user terminal 120 and may interface with the controller 280.

A number $N_{up}$ of user terminals 120 may be scheduled for simultaneous transmission on the uplink. Each of these user terminals transmits its set of processed symbol streams on the uplink to the access point.

At access point 110, $N_{ap}$ antennas 224a through 224ap receive the uplink signals from all $N_{up}$ user terminals transmitting on the uplink. For receive diversity, a transceiver front end 222 may select signals received from one of the antennas 224 for processing. The signals received from multiple antennas 224 may be combined for enhanced receive diversity. The access point's transceiver front end 222 also performs processing complementary to that performed by the user terminal's transceiver front end 254 and provides a recovered uplink data symbol stream. The recovered uplink data symbol stream is an estimate of a data symbol stream {$s_{up}$} transmitted by a user terminal. An RX data processor 242 processes (e.g., demodulates, deinterleaves, and decodes) the recovered uplink data symbol stream in accordance with the rate used for that stream to obtain decoded data. The decoded data for each user terminal may be provided to a data sink 244 for storage and/or a controller 230 for further processing. The transceiver front end (TX/RX) 222 of access point 110 and/or transceiver front end 254 of user terminal 120 may include a phase-locked loop (PLL) for generating multiple local oscillator (LO) signals, as described in more detail herein.

On the downlink, at access point 110, a TX data processor 210 receives traffic data from a data source 208 for $N_{dn}$ user terminals scheduled for downlink transmission, control data from a controller 230 and possibly other data from a scheduler 234. The various types of data may be sent on different transport channels. TX data processor 210 processes (e.g., encodes, interleaves, and modulates) the traffic data for each user terminal based on the rate selected for that user terminal. TX data processor 210 may provide a downlink data symbol streams for one of more of the $N_{dn}$ user terminals to be transmitted from one of the $N_{ap}$ antennas. The transceiver front end 222 receives and processes (e.g., converts to analog, amplifies, filters, and frequency upconverts) the symbol stream to generate a downlink signal. The transceiver front end 222 may also route the downlink signal to one or more of the $N_{ap}$ antennas 224 for transmit diversity via an RF switch, for example. The controller 230 may control the routing within the transceiver front end 222. Memory 232 may store data and program codes for the access point 110 and may interface with the controller 230.

At each user terminal 120, $N_{ut,m}$ antennas 252 receive the downlink signals from access point 110. For receive diversity at the user terminal 120, the transceiver front end 254 may select signals received from one of the antennas 252 for processing. The signals received from multiple antennas 252 may be combined for enhanced receive diversity. The user terminal's transceiver front end 254 also performs processing complementary to that performed by the access point's transceiver front end 222 and provides a recovered downlink data symbol stream. An RX data processor 270 processes (e.g., demodulates, deinterleaves, and decodes) the recovered downlink data symbol stream to obtain decoded data for the user terminal.

Figure 3:
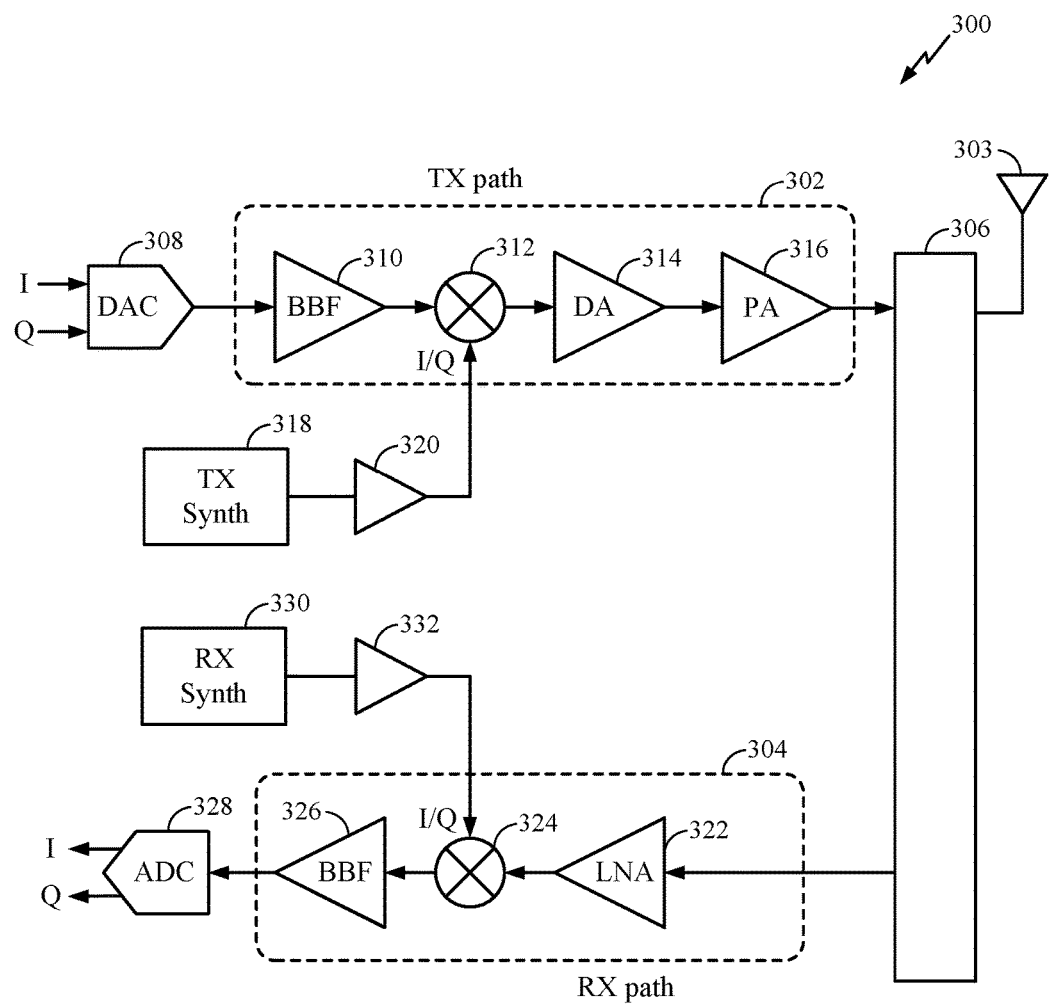
FIG. 3 is a block diagram of an example transceiver front end, in accordance with certain aspects of the present disclosure.

FIG. 3 is a block diagram of an example transceiver front end 300, such as transceiver front ends 222, 254 in FIG. 2, in which aspects of the present disclosure may be practiced. The transceiver front end 300 includes a transmit (TX) path 302 (also known as a transmit chain) for transmitting signals via one or more antennas and a receive (RX) path 304 (also known as a receive chain) for receiving signals via the antennas. When the TX path 302 and the RX path 304 share an antenna 303, the paths may be connected with the antenna via an interface 306, which may include any of various suitable RF devices, such as a duplexer, a switch, a diplexer, and the like.

Receiving in-phase (I) or quadrature (Q) baseband analog signals from a digital-to-analog converter (DAC) 308, the TX path 302 may include a baseband filter (BBF) 310, a mixer 312, a driver amplifier (DA) 314, and a power amplifier (PA) 316. The BBF 310, the mixer 312, and the DA 314 may be included in a radio frequency integrated circuit (RFIC), while the PA 316 may be external to the RFIC. The BBF 310 filters the baseband signals received from the DAC 308, and the mixer 312 mixes the filtered baseband signals with a transmit local oscillator (LO) signal to convert the baseband signal of interest to a different frequency (e.g., upconvert from baseband to RF). This frequency conversion process produces the sum and difference frequencies of the LO frequency and the frequency of the signal of interest. The sum and difference frequencies are referred to as the beat frequencies. The beat frequencies are typically in the RF range, such that the signals output by the mixer 312 are typically RF signals, which may be amplified by the DA 314 and/or by the PA 316 before transmission by the antenna 303.

The RX path 304 includes a low noise amplifier (LNA) 322, a mixer 324, and a baseband filter (BBF) 326. The LNA 322, the mixer 324, and the BBF 326 may be included in a radio frequency integrated circuit (RFIC), which may or may not be the same RFIC that includes the TX path components. RF signals received via the antenna 303 may be amplified by the LNA 322, and the mixer 324 mixes the amplified RF signals with a receive local oscillator (LO) signal to convert the RF signal of interest to a different baseband frequency (i.e., downconvert). The baseband signals output by the mixer 324 may be filtered by the BBF 326 before being converted by an analog-to-digital converter (ADC) 328 to digital I or Q signals for digital signal processing.

While it is desirable for the output of an LO to remain stable in frequency, tuning the LO to different frequencies typically entails using a variable-frequency oscillator, which involves compromises between stability and tunability. Contemporary systems may employ frequency synthesizers with a voltage-controlled oscillator (VCO) to generate a stable, tunable LO with a particular tuning range. Thus, the transmit LO frequency may be produced by a TX frequency synthesizer 318, which may be buffered or amplified by amplifier 320 before being mixed with the baseband signals in the mixer 312. Similarly, the receive LO frequency may be produced by an RX frequency synthesizer 330, which may be buffered or amplified by amplifier 332 before being mixed with the RF signals in the mixer 324. In certain aspects of the present disclosure, the TX frequency synthesizer 318 and/or RX frequency synthesizer 330 may be implemented with a phase-locked loop (PLL) for generating multiple LO signals, as described in more detail herein.

Example Techniques for Local Oscillator (LO) Phase Continuity

For certain communication protocols, such as multiple-input-multiple-output (MIMO), multiple local oscillator (LO) signals may be generated for signal transmissions via different antennas. Certain aspects of the present disclosure are directed to achieving phase continuity for multiple LO signals generated using a single phase-locked loop (PLL) and multiple LO generation circuits by performing phase correction, or at least adjustment, after generation of the LO signals.

Phase continuity involves phase detection and phase correction. During phase detection, a phase $phi_{LO}$ of a local-oscillator (LO) signal may be detected. During phase correction, the detected phase is compared with a reference phase (e.g., via an accumulator following a delta-sigma modulator (DSM)), and the phase difference is used to adjust a divide ratio of a divider in a feedback path of a phase-locked loop (PLL). In certain aspects, the PLL may include a voltage-controlled oscillator (VCO). By adjusting the divide ratio of the PLL, the VCO is phase advanced by an integer number of cycles to correct, or at least adjust, the local oscillator (LO) phase. The difference between the detected phase and the reference phase is used to adjust the divisor using a divide ratio word as an integer value. The LO edge may be shifted by an integer number of VCO cycles corresponding to the integer value of the divide ratio word. Performing phase correction by adjusting the divide ratio of the PLL frequency divider, all LOs generated based on the PLL output are affected by the correction, but only one of the LOs, based on which the phase $phi_{LO}$ was detected, may have the correct phase post-correction. Certain aspects of the present disclosure provide a phase correction technique that allows for phase correction, or at least adjustment, of multiple LO signals generated by a PLL, such that all the LO signals may potentially have the correct phase.

Figure 4A:
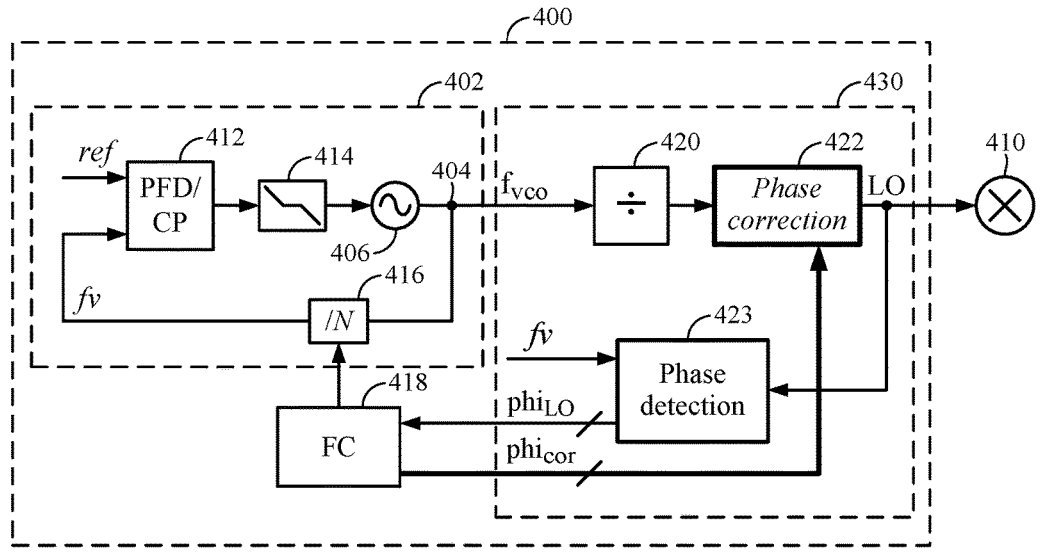
FIG. 4A is a block diagram of an example frequency synthesizer, in accordance with certain aspects of the present disclosure.

FIG. 4A is a block diagram of an example frequency synthesizer 400, in accordance with certain aspects of the present disclosure. In certain aspects, the frequency synthesizer 400 may correspond to the TX frequency synthesizer 318 or the RX frequency synthesizer 330 of FIG. 3, for generating an LO signal to be provided to a mixer 410 (e.g., corresponding to the mixer 312 or mixer 324 of FIG. 3). The frequency synthesizer 400 may include a PLL 402 configured to generate an oscillating signal at the PLL output node 404 having a frequency $f_{VCO}$. As illustrated, the PLL 402 comprises a VCO 406. The oscillating signal generated by the VCO may be provided to an LO generation circuit 430, for generating the LO signal to be provided to the mixer 410.

In certain aspects, the PLL 402 may include a phase-frequency detector (PFD)/charge pump (CP) 412. The PFD compares a feedback signal fv (based on an output or processed output of the VCO 406) to a reference frequency signal ref and controls the CP to generate an input voltage to a low-pass loop filter 414. The low-pass loop filter 414 may reject high frequency transient signals generated due to the switching activity of the CP. The low-pass loop filter 414 (also referred to as a CP filter or a PLL loop filter) may provide a control voltage to the VCO 406 that determines an oscillation frequency $f_{VCO}$ of the VCO 406. In certain aspects, as illustrated in FIG. 4, the feedback signal may be generated by dividing an output of the VCO 406 in a frequency divider 416. In certain aspects, the divide ratio N of the frequency divider 416 may be controlled by feedback control (FC) circuitry 418, as illustrated.

The LO generation circuit 430 may include at least one frequency divider 420 and a phase correction circuit 422 (also referred to herein as "a phase adjustment circuit"). In certain aspects, the oscillating signal generated by the VCO 406 is input to the frequency divider(s) 420, reducing the frequency of the oscillating signal to generate a LO signal (pre-correction). The pre-corrected LO signal is then provided to the phase correction circuit 422 to generate a phase-corrected LO signal. For example, when the PLL 402 is shut off and subsequently restarted, the phase of the signal generated by the PLL 402 may be different after the restart of the PLL as compared to the phase of the signal generated by the PLL 402 prior to the shutdown of the PLL, which may in turn cause uncertainty of the phase of the LO signal. In certain aspects, the phase of the LO signal may be maintained by maintaining phase information in the FC circuitry 418 even when the PLL is shutoff. The FC circuitry 418 controls the phase correction circuit 422 to align the phase (e.g., maintain phase continuity) of the LO signal after the restart of the PLL with the phase of the LO signal prior to the shutoff of the PLL, as described in more detail herein.

In certain aspects, the phase-continuity operations described herein may be performed when the PLL wakes up or is otherwise powered on. For example, the phase correction circuit 422 may perform phase correction to restore the phase continuity of the LO signal after the PLL is restarted, after which the phase correction circuit 422 may be disabled.

In certain aspects of the present disclosure, the frequency-divided oscillating signal fv, generated at the output of the frequency divider 416, is provided to a phase detection circuit 423. The phase detection circuit 423 detects the phase ($phi_{LO}$) of the LO signal (post-correction) and provides the phase $phi_{LO}$ to the FC circuitry 418. The signal at the output of the phase detection circuit 423 may be a digital signal having a value representing the phase $phi_{LO}$ of the LO signal. The FC circuitry 418 compares the phase $phi_{LO}$ to a reference phase and generates a phase correction signal $phi_{cor}$. The phase correction signal $phi_{cor}$ may be a digital signal having a value representing the phase difference between the detected phase $phi_{LO}$ and a reference phase. The phase correction signal $phi_{cor}$ is as provided to the phase correction circuit 422 for performing the phase correction, or at least adjustment, on the pre-correction LO signal generated by the frequency divider 420 and outputting the post-correction LO signal to the mixer 410. Performing phase correction on the pre-correction LO signal generated by the frequency divider(s) 420 allows for the phase correction circuit 422 to be replicated for multiple LO signals generated using different frequency dividers. Although only one LO generation circuit 430, one mixer 410, one phase correction circuit 422, and one phase detection circuit 423 are shown in the example of FIG. 4A, it is to be understood that these circuits may be replicated for each LO signal, such that multiple LO signals may be phase-corrected, or at least phase-adjusted.

Figure 4B:
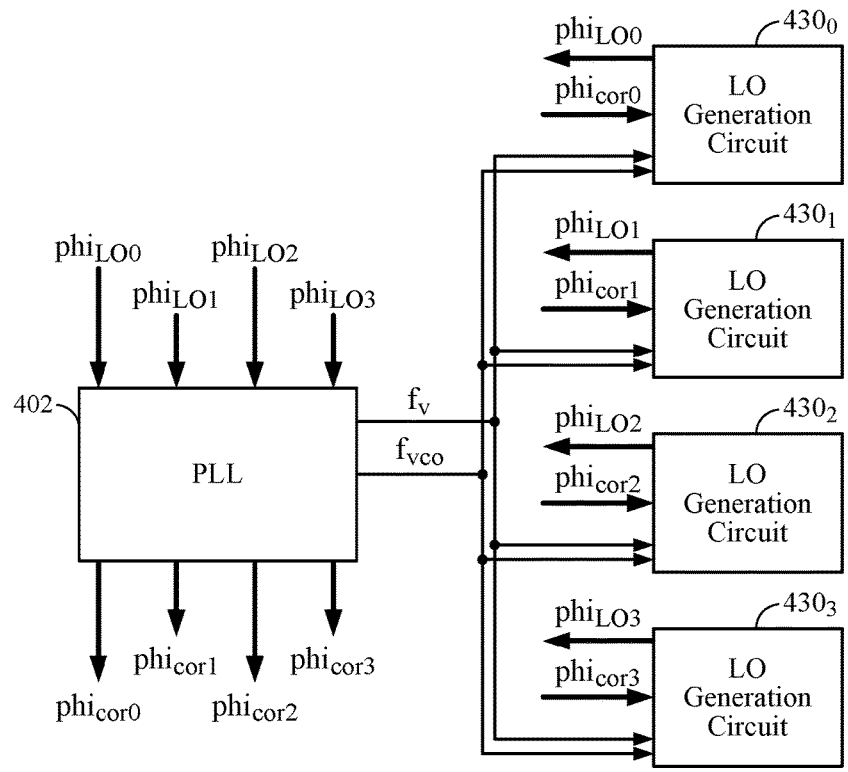
FIG. 4B is a block diagram of an example phase-locked loop (PLL) coupled to multiple LO generation circuits, in accordance with certain aspects of the present disclosure.

FIG. 4B is a block diagram of the PLL 402 coupled to multiple LO generation circuits $430_0$, $430_1$, $430_2$, and $430_3$ (collectively referred to as LO generation circuits 430), in accordance with certain aspects of the present disclosure. Each of the LO generation circuits 430 may generate a different $phi_{LO}$ signal (e.g., $phi_{LO0}$, $phi_{LO1}$, $phi_{LO2}$, or $phi_{LO3}$ signal) which is provided to the PLL 402, and receive a different $phi_{cor}$ signal (e.g., $phi_{cor0}$, $phi_{cor1}$, $phi_{cor2}$, or $phi_{cor3}$ signal) from the PLL 402. Although four LO generation circuits 430 are represented in FIG. 4B, it is to be understood that more or less than four LO generation circuits 430 may be employed. In general, at least one LO generation circuit 430 is employed, while in MIMO configurations, for example, a plurality of LO generation circuits 430 may be employed. Certain aspects of the present disclosure allow for the LO phase correction to be self-contained on the LO side (e.g., performed on the pre-corrected LO signal). That is, the phase correction, or at least adjustment, is performed based on the signal generated by the frequency divider(s) 420 of the LO generation circuit 430. Therefore, a single PLL 402 can drive multiple LO generation circuits 430 simultaneously, while maintaining phase continuity on all the generated LO signals. In certain aspects, the phase-continuity operations described herein may be performed when the PLL wakes up or is otherwise powered on.

Figure 5:
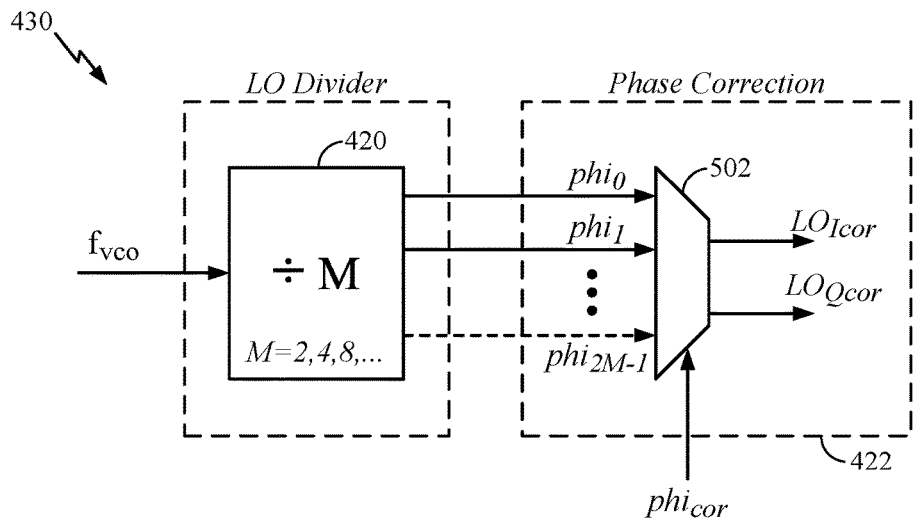
FIG. 5 is a block diagram of an example local oscillator (LO) generation circuit having a phase correction circuit, in accordance with certain aspects of the present disclosure.

FIG. 5 is a block diagram of an example LO generation circuit 430 having a phase correction circuit 422 implemented for the frequency divider 420 having a $2^n$ frequency divider ratio, in accordance with certain aspects of the present disclosure. For example, the oscillating signal $f_{VCO}$ generated by the VCO 406 may be provided to the frequency divider 420 (div-M) having a $2^n$ frequency divider ratio, n being an integer. That is, the divide ratio M of the frequency divider 420 may be 2, 4, 8, etc. The frequency divider 420 can be configured to generate $2 \times M$ number of signals ($phi_0$, $phi_1$, ..., $phi_{2M-1}$) having different phases. In this case, since the divide ratio of the frequency divider 420 is $2^n$, the in-phase (I) and quadrature (Q) LO signals can be selected straight from the 2×M number of signals generated by the frequency divider 420. Thus, the phase correction circuit 422 may include a multiplexer 502 following the frequency divider 420 which may select, based on the phi$_{cor}$ signal, two of the 2×M signals and output the phase-corrected (or at least phase-adjusted) I and Q signals LO$_{Icor}$ and LO$_{Qcor}$.

Figure 6:
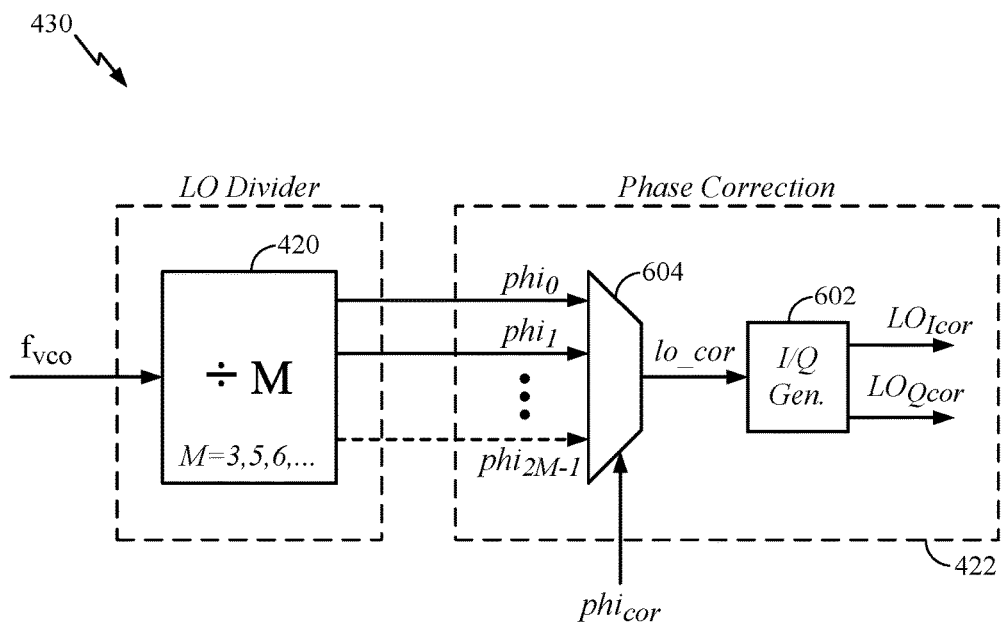
FIG. 6 is a block diagram of an example LO generation circuit having a phase correction circuit implemented with an in-phase (I) and quadrature (Q) generation circuit, in accordance with certain aspects of the present disclosure.

FIG. 6 is a block diagram of an example LO generation circuit 430 having a phase correction circuit 422 implemented for a frequency divider 420 having a divide ratio that is not 2$^n$, in accordance with certain aspects of the present disclosure. For example, in this case, the divide ratio M of the frequency divider 420 may be 3, 5, 6, etc. In this case, since the divide ratio of the frequency divider 420 is not 2$^n$, the I and Q signals may not be readily available at the output of the frequency divider 420. Thus, the phase correction circuit 422 may include an I/Q generation circuit 602 for generating the corrected (or at least adjusted) I and Q signals LO$_{Icor}$ and LO$_{Qcor}$ based on one of the 2×M signals selected and outputted by the frequency divider 420. For example, the multiplexer 604 of the phase correction circuit 422 may select one of the 2×M signals based on the phi$_{cor}$ signal, which is provided to the I/Q generator circuit 602 for generation of the corrected (or at least adjusted) I and Q signals LO$_{Icor}$ and LO$_{Qcor}$.

Figure 7:
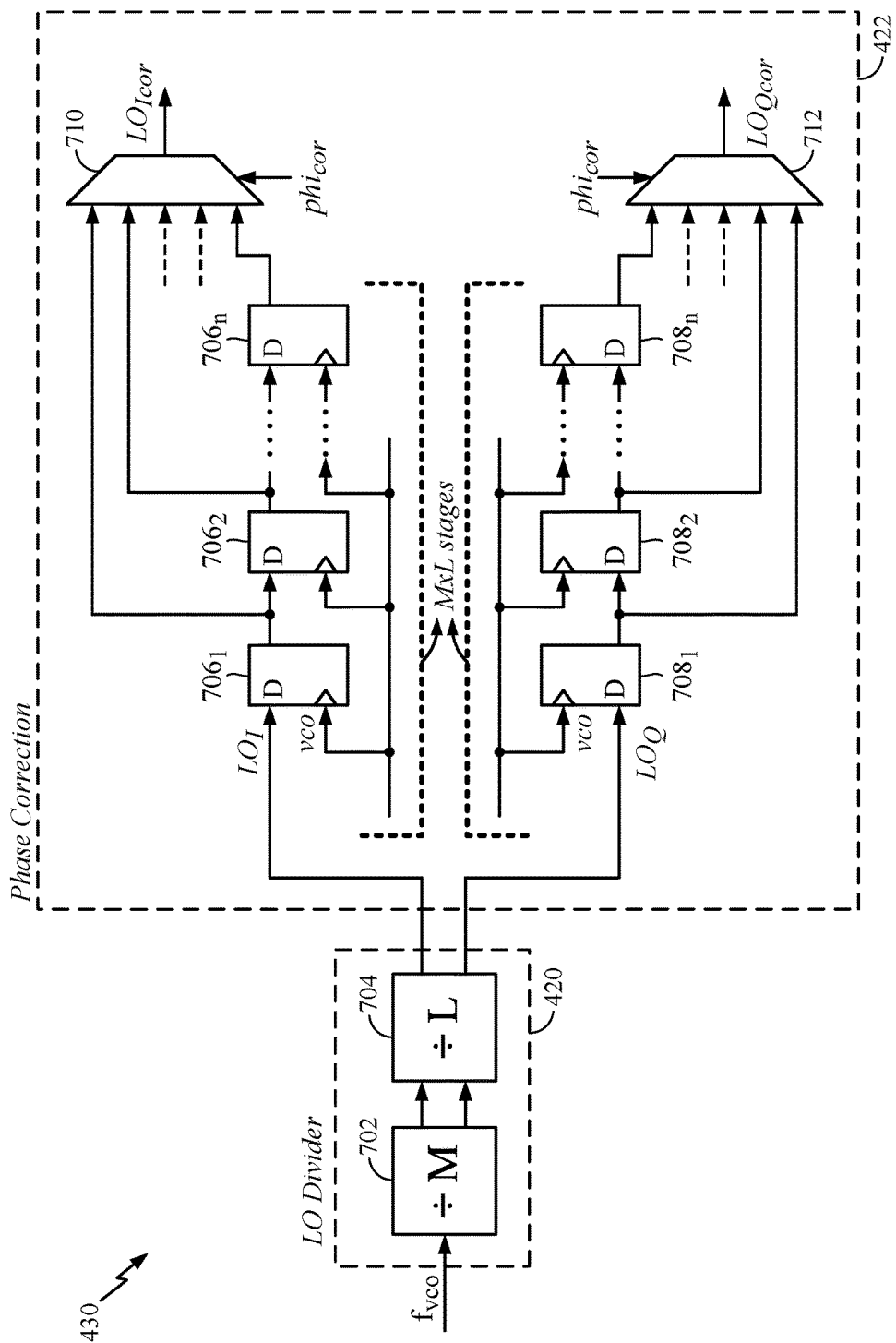
FIG. 7 is a block diagram of an example LO generation circuit having a phase correction circuit implemented for a cascaded LO divider, in accordance with certain aspects of the present disclosure.

FIG. 7 is a block diagram of an example LO generation circuit 430 having a phase correction circuit 422 implemented for a cascaded LO divider, in accordance with certain aspects of the present disclosure. As used herein, a cascaded divider generally refers to multiple frequency dividers connected in series. For example, the frequency divider 420 may include a first frequency divider 702 coupled to a second frequency divider 704 having divide ratios M and L, respectively. The first frequency divider 702 generates one or more frequency-divided signals (two are shown) by frequency dividing the oscillating signal f$_{VCO}$ by M, which are further divided by the second frequency divider 704 having a divide ratio of L.

In some cases, the divide ratio L may be 2$^n$, and thus, pre-corrected I/Q LO signals LO$_I$ and LO$_Q$ are available at the outputs of the second frequency divider 704. For phase correction, n=M×L number of I-chain flip-flops (FFs) 706$_1$, 706$_2$, ..., 706$_n$ (collectively referred to as FFs 706) may be used to generate M×L number of signals having different phases from the LO$_I$ signal, and n=M×L number of Q-chain FFs 708$_1$, 708$_2$, ..., 708$_n$ (collectively referred to as FFs 708) may be used to generate M×L number of signals having different phases from the LO$_Q$ signal, as illustrated. The I-chain FFs 706 and the Q-chain FFs 708 may be clocked by the VCO. In this case, the phases of the signals generated by the I-chain FFs 706 are each separated by one VCO cycle, and the phases of the signals generated by the Q-chain FFs 708 are each separated by one VCO cycle. The phase correction circuit 422 includes a multiplexer 710 for selecting, based on the phi$_{cor}$ signal, one of the signals generated by the I-chain FFs 706 to generate the corrected I LO signal LO$_{Icor}$, and a multiplexer 712 for selecting, based on the phi$_{cor}$ signal, one of the signals generated by the Q-chain FFs 708 to generate the corrected Q LO signal LO$_{Qcor}$.

Figure 8:
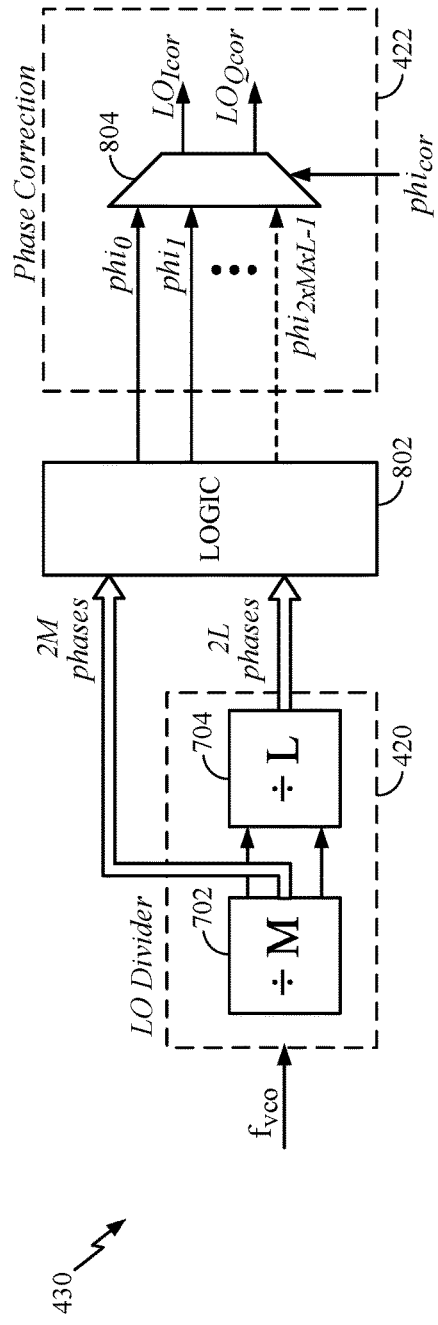
FIG. 8 is a block diagram of an example LO generation circuit having a phase correction circuit implemented for a cascaded LO divider having a $2^n$ divide ratio, in accordance with certain aspects of the present disclosure.

FIG. 8 is a block diagram of an example LO generation circuit 430 having a phase correction circuit 422 for a cascaded LO divider having a 2$^n$ divide ratio, in accordance with certain aspects of the present disclosure. For example, the product of the divide ratios (M×L) of the first frequency divider 702 and the second frequency divider 704 may be 2$^n$. In this case, the first frequency divider 702 may provide 2×M number of signals having different phases, and the second frequency divider 704 may provide 2×L number of signals having different phases. Logic 802 may receive the 2×M number of signals and the 2×L number of signals and generate 2×M×L number of signals (phi$_0$, phi$_1$, ..., phi$_{2×M×L-1}$) having different phases. The 2×M×L number of signals may be provided to a multiplexer 804 of the phase correction circuit 422. The multiplexer 804 may select two of the signals generated by the logic 802 to generate the corrected I and Q signals LO$_{Icor}$ and LO$_{Qcor}$.

Figure 9:
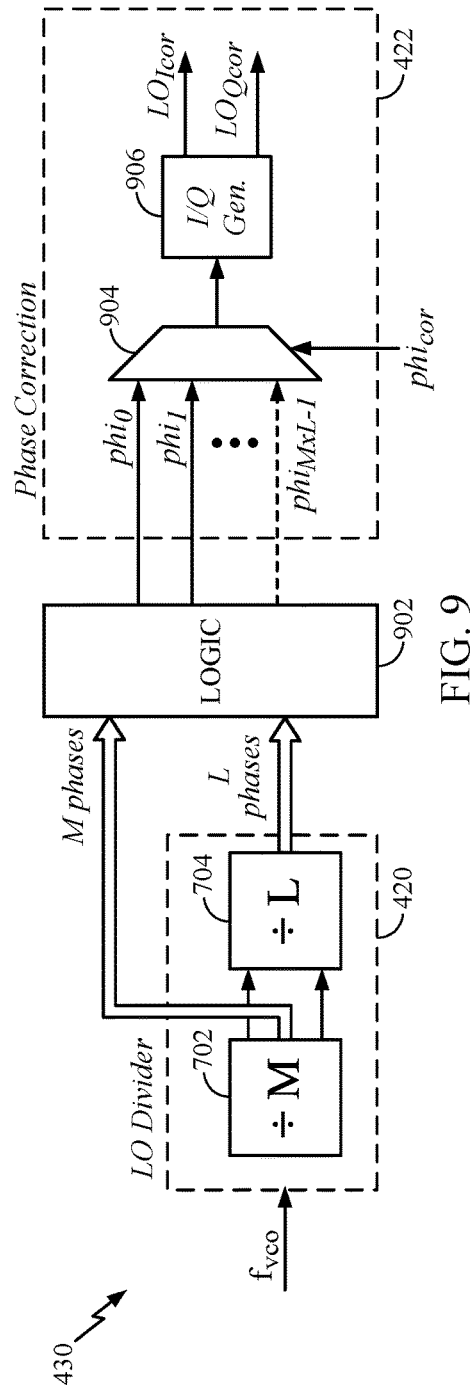
FIG. 9 is a block diagram of an example LO generation circuit having a phase correction circuit implemented for a cascaded LO divider having a non-$2^n$ divide ratio, in accordance with certain aspects of the present disclosure.

FIG. 9 is a block diagram of an example LO generation circuit 430 having a phase correction circuit 422 for a cascaded LO divider having a non-2$^n$ divide ratio, in accordance with certain aspects of the present disclosure. For example, the product of the divide ratios (M×L) of the first frequency divider 702 and the second frequency divider 704 may not be 2$^n$. In this case, the first frequency divider 702 may provide M number of signals having different phases, and the second frequency divider 704 may provide L number of signals having different phases. Logic 902 may receive the M number of signals and the L number of signals generated by the first frequency divider 702 and the second frequency divider 704 and generate M×L number of signals (phi$_0$, phi$_1$, ..., phi$_{M×L-1}$) having different phases. The M×L number of signals may be provided to a multiplexer 904 of the phase correction circuit 422. The multiplexer 904 may select one of the M×L number of signals generated by the logic 902 for phase correction, which is provided to an I/Q generator circuit 906 to generate the corrected I and Q signals LO$_{Icor}$ and LO$_{Qcor}$.

Figure 10:
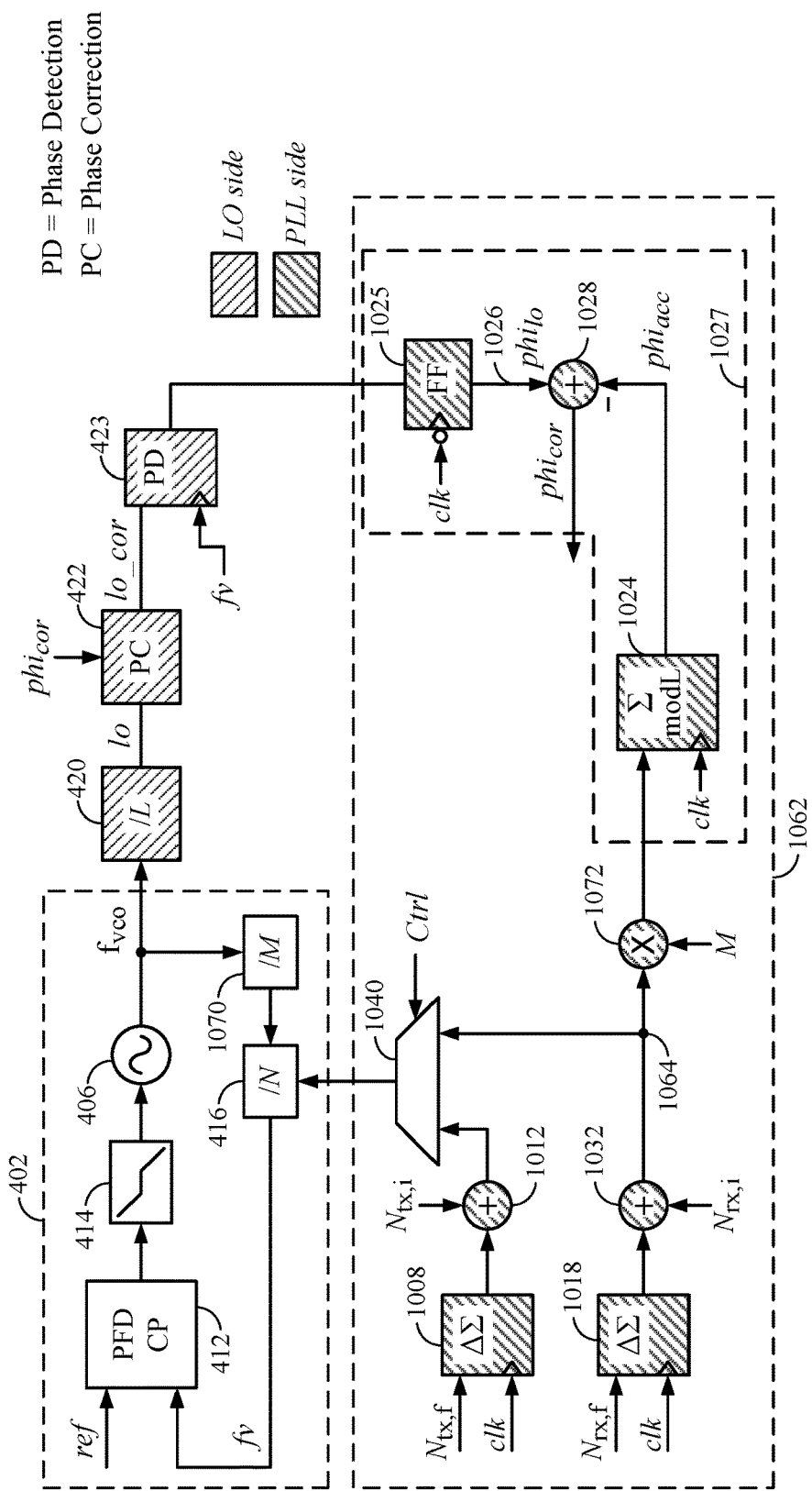
FIG. 10 illustrates implementation details of an example frequency synthesizer, in accordance with certain aspects of the present disclosure.

FIG. 10 illustrates implementation details of the example frequency synthesizer 400, in accordance with certain aspects of the present disclosure. As illustrated, the frequency synthesizer 400 of FIG. 10 supports both a receive mode and a transmit mode of communication. For example, a frequency (and/or phase) of the PLL 402 may be controlled based on whether the frequency synthesizer 400 is operating according to a receive mode of operation or a transmit mode of operation. A feedback control system 1062 (e.g., also referred to as "feedback control circuitry") may be introduced to control the frequency of the PLL 402. For example, the feedback control system 1062 may provide control signals to the frequency divider 416 to control the frequency (and/or phase) of the PLL 402.

In certain aspects, the feedback control system 1062 may include a DSM 1018 in a receive chain and a DSM 1008 in a transmit chain. A frequency control signal N$_{tx,f}$ may be provided by a transmitter, and a frequency control signal N$_{rx,f}$ may be provided by a receiver, to control the DSM 1008 and the DSM 1018, respectively. The frequency control signal N$_{tx,f}$ and the frequency control signal N$_{rx,f}$ may be fractional values to create a fractional frequency divider ratio for the frequency divider 416. For example, a frequency control signal N$_{tx,i}$ may be provided by the transmitter, and a frequency control signal N$_{rx,i}$ may be provided by the receiver, to control the frequency divider 416. The frequency control signal N$_{tx,i}$ and the frequency control signal N$_{rx,i}$ may be based on an integer part of a frequency control signal to be respectively used in conjunction with outputs from the DSMs 1018 and 1008 to create the fractional frequency divider ratio.

The combiners 1012 and 1032 combine the outputs of the DSMs 1008 and 1018 and the frequency control signals N$_{tx,i}$ and N$_{rx,i}$, respectively, and provide the results to a selector 1040. The selector 1040 is introduced to select the outputs generated by the combiners 1012 and 1032, based on a control signal (ctrl), depending on whether a receive mode or transmit mode of operation is active. The output of the selector 1040 is then provided to the frequency divider 416.

The fractional part of the output of the combiner (e.g., combiner 1032) may not be directly provided to the frequency divider 416 because the frequency divider 416 may only be able to receive integer numbers. Accordingly, the output of the combiner (e.g., combiner 1032) may be processed by the selector 1040 prior to being provided to the frequency divider 416. For example, the selector 1040 may convert the fractional part of the frequency control signal into integer bits.

In certain aspects, the feedback control system 1062 may include a phase adjustment determination circuit 1027 having an accumulator 1024 that predicts the phase of the pre-corrected LO signal generated by the frequency divider 420. For example, the accumulator 1024 may be coupled to node 1064 and accumulates the frequency control signal used to control the frequency divider 416. In certain aspects, the accumulator 1024 (e.g., modulo function logic) may have a frequency division factor corresponding to the divide ratio of the frequency divider 420. For example, the accumulator 1024 may be implemented as a modulo 2 accumulator when the frequency divider 420 has a divide ratio of 2. The operations of the accumulator 1024 are described in more detail in U.S. Pat. No. 9,893,875, issued Feb. 13, 2018 and entitled "Phase Continuity Technique for Frequency Synthesis," which is incorporated by reference herein in its entirety.

As illustrated, the output of the frequency divider 420 may be coupled to a phase correction circuit 422 as previously described with respect to FIGS. 4-9. The output of the phase correction circuit 422 may be coupled to a phase detection circuit 423, which may detect the phase of the corrected LO signal with respect to the frequency divided signal $f_v$ generated at the output of the frequency divider 416. The output of the phase detection circuit 423 is provided to a FF 1025 of the phase adjustment determination circuit 1027 for synchronization to the clock signal (clk).

The FF 1025 generates the LO phase $phi_{lo}$ signal (e.g., at a $phi_{lo}$ node 1026), which is provided to a combiner 1028 of the phase adjustment determination circuit 1027. The $phi_{lo}$ signal is compared to a reference phase $phi_{acc}$ as represented by the signal output by the accumulator 1024. For example, the signal output by the accumulator 1024 may be a digital signal having a value representing the reference phase $phi_{acc}$ to be compared with the phase $phi_{LO}$ of the LO signal to generate a phase correction signal $phi_{cor}$. The output of the combiner 1028 represents the error in the phase of the LO signal and is fed back to the phase correction circuit 422 for correction of the LO phase. For example, when there is no phase error in the corrected LO signal, the accumulator phase signal $phi_{acc}$ at the output of the accumulator 1024 is equal to the LO phase $phi_{lo}$ signal. However, the accumulator phase signal $phi_{acc}$ may not be equal to the $phi_{lo}$ signal when there is phase discontinuity in the corrected LO signal generated by the phase correction circuit 422. In this case, the difference between the accumulator phase signal $phi_{acc}$ and the $phi_{lo}$ signal may represent this phase discontinuity and may be used to correct the phase error of the corrected LO signal via the phase correction circuit 422.

For high frequency VCOs, it may be useful to include a frequency divider 1070 to frequency divide the oscillating signal output by the VCO 406 prior to further frequency division performed by the frequency divider 416. This may not be possible if phase correction was implemented by adjusting the divide ratio of the frequency divider 416 while also maintaining phase continuity. Implementing the phase correction circuit 422 at the output of the frequency divider 420 allows for the addition of a frequency divider 1070 (e.g., having a fixed divide ratio) to reduce the frequency of the oscillating signal $f_{VCO}$ before being input to the frequency divider 416. This may be performed by adding a multiplier 1072 between the node 1064 and the accumulator 1024, as illustrated. The multiplier 1072 adjusts the signal (e.g., digital value) at node 1064 by multiplying the signal by a factor of M, M being the divide ratio of the frequency divider 1070, to account for the effect of the frequency divider 1070 on the reference phase $phi_{acc}$.

Figure 11:
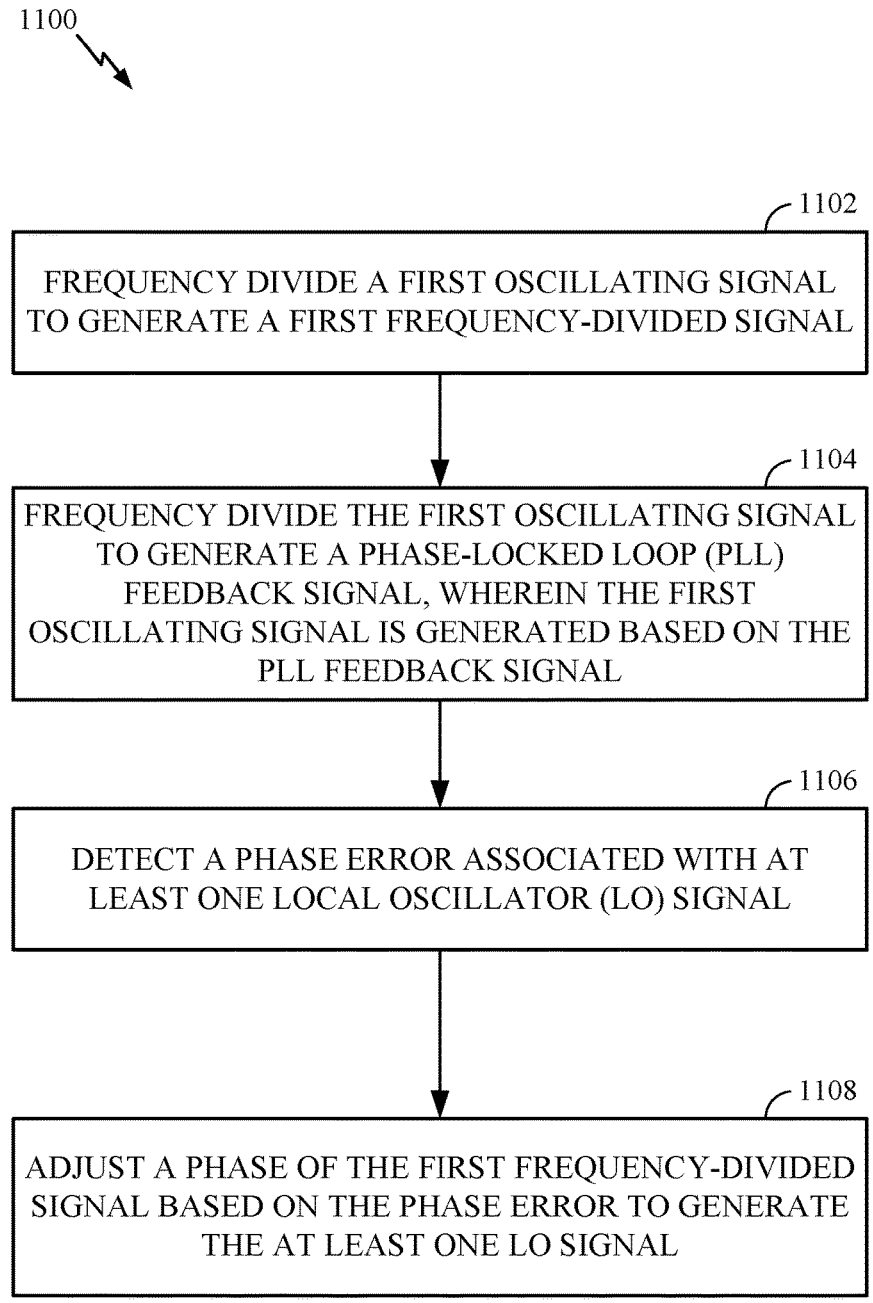
FIG. 11 is a flow diagram illustrating example operations for phase adjustment, in accordance with certain aspects of the present disclosure.

FIG. 11 is a flow diagram illustrating example operations 1100 for phase adjustment, in accordance with certain aspects of the present disclosure. The operations 1100 may be performed by a circuit such as the circuits of FIGS. 4A, 4B, 5, 6, 7, 8, 9, and 10.

The operations 1100 begin, at block 1102, by frequency dividing (e.g., via frequency divider 420) a first oscillating signal to generate a first frequency-divided signal. At block 1104, the first oscillating signal is frequency divided to generate a phase-locked loop (PLL) feedback signal. The first oscillating signal is generated based on the PLL feedback signal. At block 1106, the circuit may detect (e.g., via phase detection circuit 423 and the feedback control system 1062) a phase error associated with at least one local oscillator (LO) signal. At block 1108, the operations 1100 continue by adjusting (e.g., via the phase correction circuit 422) a phase of the first frequency-divided signal based on the phase error to generate the at least one LO signal.

In certain aspects, frequency dividing the first oscillating signal to generate the PLL feedback signal at block 1104 may involve frequency dividing (e.g., via frequency divider 1070) the first oscillating signal by a factor M to generate a second oscillating signal. In this case, the operations 1100 may also include frequency dividing the second oscillating signal to generate the PLL feedback signal.

In certain aspects the operations 1100 may also include multiplying (e.g., via the multiplier 1072) a ratio control signal (e.g., a digital value of the signal at node 1064) by the factor M. In this case, the PLL feedback signal may be generated by frequency dividing the second oscillating signal by a divide ratio selected based on the ratio control signal. In certain aspects, the operations 1100 may also include estimating (e.g., via accumulator 1024) a phase of the first frequency-divided signal based on the multiplied ratio control signal, and determining the phase error by determining (e.g., via combiner 1028) a difference between a phase of the LO signal and the estimated phase of the PLL feedback signal.

In certain aspects, frequency dividing the first oscillating signal to generate the first frequency-divided signal at block 1102 comprises generating a plurality of signals having different phases based on the first oscillation signal. In this case, adjusting the phase of the first frequency-divided signal at block 1106 comprises selecting (e.g., via multiplexer 502) at least one of the plurality of signals having different phases to generate the at least one LO signal.

In certain aspects, frequency dividing the first oscillating signal to generate the first frequency-divided signal at block 1102 comprises frequency dividing the first oscillating signal by a factor of $2^n$ to generate a plurality of signals having different phases, n being an integer. In this case, adjusting the phase of the first frequency-divided signal at block 1106 comprises selecting (e.g., via multiplexer 502) two signals of the plurality of signals having different phases, the two signals being in-phase (I) and quadrature (Q) signals.

In certain aspects, frequency dividing the first oscillating signal to generate the first frequency-divided signal at block 1102 comprises frequency dividing the first oscillating signal by a factor other than $2^n$ to generate a plurality of signals having different phases, n being an integer. In this case, adjusting the phase of the first frequency-divided signal at block 1106 may include selecting (e.g., via multiplexer 604) a signal from the plurality of signals having different phases, and generating (e.g., via I/Q generator circuit 602) I and Q signals based on the selected signal from the plurality of signals.

In certain aspects, frequency dividing the first oscillating signal to generate the first frequency-divided signal at block 1102 comprises generating I and Q signals. In this case, generating the at least one LO signal may include generating (e.g., via FFs 706) a first plurality of signals having different phases based on the I signal, generating (e.g., via FFs 708) a second plurality of signals having different phases based on the Q signal, selecting (e.g., via multiplexer 710) a first signal of the first plurality of signals based on the phase error, the first signal being an in-phase LO signal, and selecting (e.g., via multiplexer 712) a second signal of the second plurality of signals based on the phase error, the second signal being a quadrature LO signal.

In certain aspects, frequency dividing the first oscillating signal to generate the first frequency-divided signal at block 1102 may include frequency dividing (e.g., via the first frequency divider 702) the first oscillating signal by a factor M to generate a first plurality of signals having different phases, and frequency dividing (e.g., via the second frequency divider 704) at least one of the first plurality of signals by a factor L to generate a second plurality of signals having different phases.

In certain aspects, the first plurality of signals comprises 2×M number of signals, and the second plurality of signals comprises 2×L number of signals. In this case, the generation of the at least one LO signal may also include generating (e.g., via logic 802) a third plurality of signals comprising 2×M×L number of signals based on the first and second pluralities of signals, and selecting (e.g., via multiplexer 804) two signals from the first and second pluralities of signals, the two signals being in-phase (I) and quadrature (Q) LO signals. In certain aspects, a product of the divide ratios M and L is equal to $2^n$, n being an integer.

In certain aspects, the first plurality of signals comprises M number of signals, and the second plurality of signals comprises L number of signals. In this case, the generation of the at least one LO signal may also include generating (e.g., via logic 902) a third plurality of signals comprising M×L number of signals based on the first and second pluralities of signals, selecting (e.g., via multiplexer 904) a signal from the third plurality of signals, and generating (e.g., via I/Q generation circuit 906) I and Q LO signals based on the selected signal.

Figure 12:
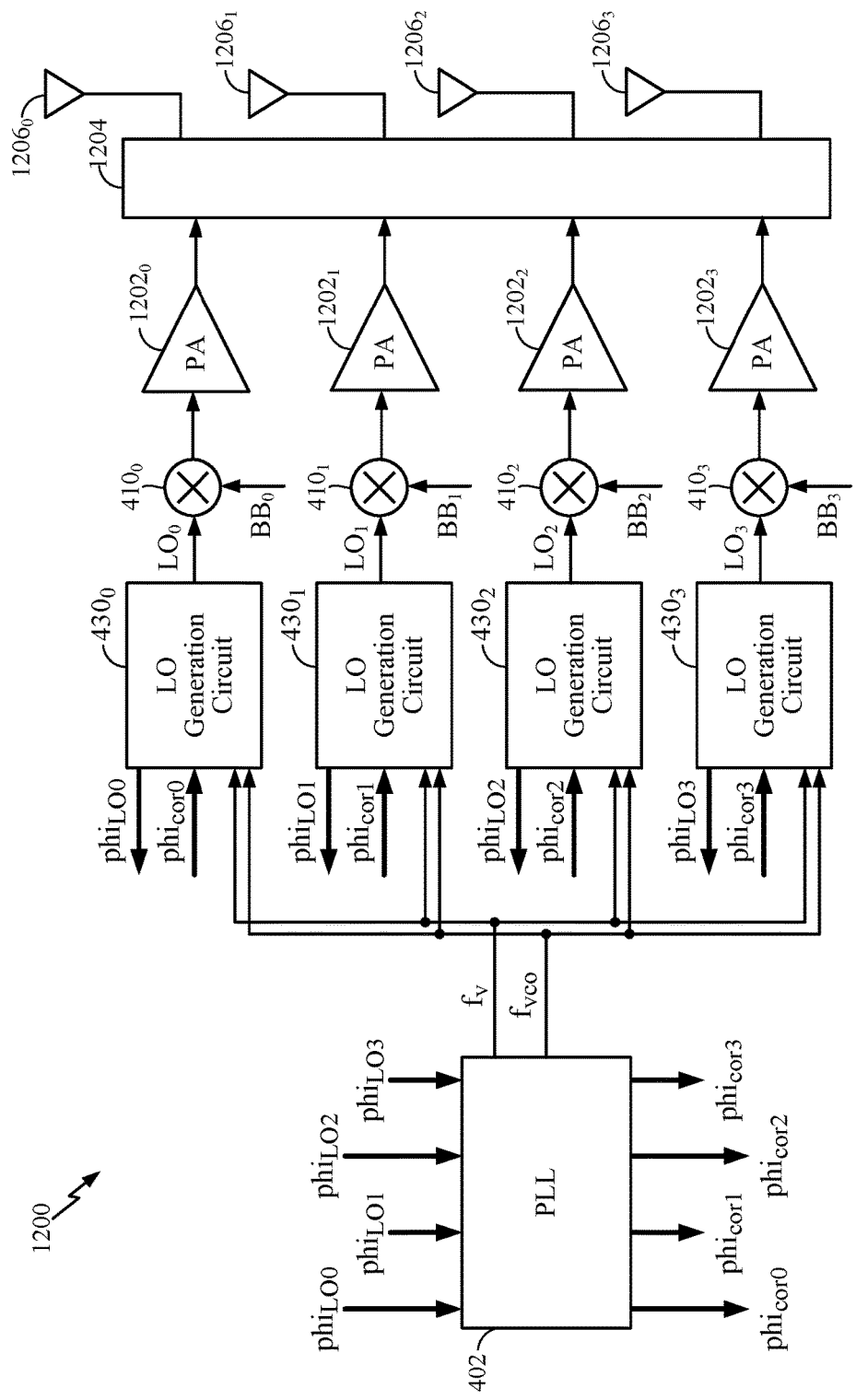
FIG. 12 is a block diagram of an example multiple input multiple output (MIMO) structure implemented using multiple LO generation circuits, in accordance with certain aspects of the present disclosure.

FIG. 12 is a block diagram of a MIMO structure 1200 implemented using multiple LO generation circuits, in accordance with certain aspects of the present disclosure. As illustrated, the LO generations circuits $430_0$, $430_1$, $430_2$, and $430_3$ generate different LO signals $LO_0$, $LO_1$, $LO_2$, and $LO_3$, respectively, for each of multiple transmit chains of the MIMO structure. Each of the mixers $410_0$, $410_1$, $410_2$, and $410_3$ (collectively referred to as "mixers 410") performs frequency mixing of a respective baseband (BB) signal $BB_0$, $BB_1$, $BB_2$, and $BB_3$ for a respective one of the transmit chains. The upconverted signals generated at outputs of the mixers 410 are amplified by respective power amplifiers (PAs) $1202_0$, $1202_1$, $1202_2$, and $1202_3$ (collectively referred to as "PAs 1202").

The amplified signals generated by the PAs 1202 are provided to an interface 1204 which may include any of various suitable RF devices, such as duplexers, switches, diplexers, and the like to interconnect each of the transmit chains with one of the antennas $1206_0$, $1206_1$, $1206_2$, and $1206_3$ for MIMO transmission. While FIG. 12 describes an example MIMO structure having multiple transmit chains to facilitate understanding, aspects of the present disclosure may also be applied to a MIMO structure having multiple receive chains, each implemented with an LO generation circuit in accordance with certain aspects of the present disclosure.

The various operations of methods described above may be performed by any suitable means capable of performing the corresponding functions. The means may include various hardware component(s) and/or module(s), including, but not limited to one or more circuits. Generally, where there are operations illustrated in figures, those operations may have corresponding counterpart means-plus-function components with similar numbering. In certain aspects, means for multiplying may comprise, for example, a multiplier such as the multiplier 1072. In certain aspects, means for estimating a phase may comprise, for example, a phase detector such as the phase detection circuit 423. In certain aspects, means for frequency dividing may comprise, for example, a frequency divider such as the frequency divider 1070, 416, and/or 420. In certain aspects, means for detecting a phase error may comprise, for example, FC circuitry such as the FC circuitry 418 of FIG. 4A, or a feedback control system, such as the feedback control system 1062 of FIG. 10. In certain aspects, means for adjusting a phase may comprise, for example, a phase correction circuit such as the phase correction circuit 422.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The various illustrative logical blocks, modules, and circuits described in connection with the present disclosure may be implemented or performed with discrete hardware components designed to perform the functions described herein.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. An apparatus for phase adjustment, comprising:
a phase-locked loop (PLL);
at least one first frequency divider coupled to an output of the PLL, the at least one first frequency divider being external to the PLL;
a phase adjustment circuit having an input coupled to an output of the at least one first frequency divider;
at least one mixer having an input coupled to at least one output of the phase adjustment circuit; and
a phase detection circuit having an input coupled to the output of the phase adjustment circuit.

2. The apparatus of claim 1, further comprising:
feedback control circuitry configured to control a frequency of a feedback signal of the PLL, an output of the phase detection circuit being coupled to a local oscillator phase ($phi_{lo}$) node of the feedback control circuitry.

3. The apparatus of claim 2, wherein the PLL comprises:
a second frequency divider; and
a voltage-controlled oscillator (VCO), an output of the VCO being coupled to an input of the second frequency divider.

4. The apparatus of claim 2, wherein the PLL further comprises:
a third frequency divider configured to divide a frequency of an oscillating signal generated by the VCO by a factor M, an output of the third frequency divider being coupled to an input of the second frequency divider.

5. The apparatus of claim 4, further comprising:
a multiplier circuit coupled to a divide ratio control node and configured to multiply a signal at the divide ratio control node by the factor M, the divide ratio control node being selectively coupled to a divide ratio control input of the second frequency divider; and
a phase adjustment determination circuit having a first input coupled to the output of the phase detection circuit and a second input coupled to an output of the multiplier circuit, an output of the phase adjustment determination circuit being coupled to a control input of the phase adjustment circuit.

6. The apparatus of claim 1, wherein:
the at least one first frequency divider is configured to generate a plurality of signals having different phases based on an oscillation signal generated by the PLL; and
the phase adjustment circuit comprises a multiplexer configured to select at least one of the plurality of signals having different phases to output one or more local oscillator (LO) signals for the at least one mixer.

7. The apparatus of claim 6, further comprising:
a phase adjustment determination circuit having an input coupled to an output of the phase detection circuit and at least one output coupled to at least one control input of the multiplexer to select the at least one of the plurality of signals having different phases.

8. The apparatus of claim 1, wherein:
the PLL is configured to generate an oscillating signal;
the at least one first frequency divider is configured to divide a frequency of the oscillation signal by $2^n$ to generate a plurality of signals having different phases, n being an integer; and
the phase adjustment circuit comprises a multiplexer configured to select two signals of the plurality of signals having different phases, the two signals being in-phase (I) and quadrature (Q) signals.

9. The apparatus of claim 1, wherein:
the PLL is configured to generate an oscillating signal;
the at least one first frequency divider is configured to divide a frequency of the oscillation signal by a divide ratio other than $2^n$ to generate a plurality of signals having different phases, n being an integer; and
the phase adjustment circuit comprises:
a multiplexer configured to select one of the plurality of signals having different phases; and
an in-phase (I)/quadrature (Q) generation circuit coupled to an output of the multiplexer and configured to generate I and Q signals based on the signal selected by the multiplexer.

10. The apparatus of claim 1, wherein:
the phase adjustment circuit comprises a first set of flip-flops, a second set of flip-flops, a first multiplexer, and a second multiplexer;
a first output of the at least one first frequency divider is coupled to an input of one of the first set of flip-flops;
a second output of the at least one first frequency divider is coupled to an input of one of the second set of flip-flops;
inputs of the first multiplexer are coupled to outputs of the first set of flip-flops; and
inputs of the second multiplexer are coupled to outputs of the second set of flip-flops.

11. The apparatus of claim 10, wherein:
the at least one first frequency divider is configured to generate in-phase (I) and quadrature (Q) signals;
the first set of flip-flops is configured to generate a first plurality of signals having different phases based on the I signal;
the second set of flip-flops is configured to generate a second plurality of signals having different phases based on the Q signal;
the first multiplexer is configured to output an in-phase local oscillator (LO) signal by selecting one of the first plurality of signals; and
the second multiplexer is configured to output a quadrature LO signal by selecting one of the second plurality of signals.

12. The apparatus of claim 1, wherein the at least one first frequency divider comprises:
a first frequency divider configured to generate a first plurality of signals having different phases; and
a second frequency divider configured generate a second plurality of signals having different phases.

13. The apparatus of claim 12, wherein:
the first plurality of signals comprises 2×M number of signals, M being a divide ratio of the at least one first frequency divider;
the second plurality of signals comprises 2×L number of signals, L being a divide ratio of the second frequency divider;
the apparatus further comprises logic having a first plurality of inputs coupled to outputs of the at least one first frequency divider and a second plurality of inputs coupled to outputs of the second frequency divider, the logic being configured to generate a third plurality of signals comprising 2×M×L number of signals based on the first and second pluralities of signals; and
the phase adjustment circuit comprises a multiplexer configured to select two signals from the first and second pluralities of signals, the two signals being in-phase (I) and quadrature (Q) signals.

14. The apparatus of claim 13, wherein a product of the divide ratios M and L is equal to $2^n$, n being an integer.

15. The apparatus of claim 12, wherein:
the first plurality of signals comprises M number of signals, M being a divide ratio of the at least one first frequency divider;
the second plurality of signals comprises L number of signals, L being a divide ratio of the second frequency divider;
the apparatus further comprises logic having a first plurality of inputs coupled to outputs of the at least one first frequency divider and a second plurality of inputs coupled to outputs of the second frequency divider, the logic being configured to generate a third plurality of signals comprising M×L number of signals based on the first and second pluralities of signals; and
the phase adjustment circuit comprises:
a multiplexer configured to select a signal from the third plurality of signals; and
an in-phase (I)/quadrature (Q) generation circuit having an input coupled to an output of the multiplexer and configured to generate I and Q signals based on the signal selected by the multiplexer.

16. A method for phase adjustment, comprising:
frequency dividing a first oscillating signal to generate a first frequency-divided signal;
frequency dividing the first oscillating signal to generate a phase-locked loop (PLL) feedback signal, wherein the first oscillating signal is generated based on the PLL feedback signal;
detecting a phase error associated with at least one local oscillator (LO) signal; and
adjusting a phase of the first frequency-divided signal based on the phase error to generate the at least one LO signal.

17. The method of claim 16, wherein frequency dividing the first oscillating signal to generate the PLL feedback signal further comprises frequency dividing the first oscillating signal by a factor M to generate a second oscillating signal, the method further comprising frequency dividing the second oscillating signal to generate the PLL feedback signal.

18. The method of claim 17, further comprising:
multiplying a ratio control signal by the factor M, wherein the PLL feedback signal is generated by frequency dividing the second oscillating signal by a divide ratio selected based on the ratio control signal; and
estimating a phase of the first frequency-divided signal based on the multiplied ratio control signal, wherein the phase error is detected by determining a difference between a phase of the LO signal and the estimated phase of the PLL feedback signal.

19. The method of claim 16, wherein:
frequency dividing the first oscillating signal to generate the first frequency-divided signal comprises generating a plurality of signals having different phases based on the first oscillation signal; and
adjusting the phase of the first frequency-divided signal comprises selecting at least one of the plurality of signals having different phases to generate the at least one LO signal.

20. The method of claim 16, wherein:
frequency dividing the first oscillating signal to generate the first frequency-divided signal comprises frequency dividing the first oscillating signal by a factor of $2^n$ to generate a plurality of signals having different phases, n being an integer; and
adjusting the phase of the first frequency-divided signal comprises selecting two signals of the plurality of signals having different phases, the two signals being in-phase (I) and quadrature (Q) signals.

21. The method of claim 16, wherein:
frequency dividing the first oscillating signal to generate the first frequency-divided signal comprises frequency dividing the first oscillating signal by a factor other than $2^n$ to generate a plurality of signals having different phases, n being an integer;
adjusting the phase of the first frequency-divided signal comprises selecting a signal from the plurality of signals having different phases; and
generating in-phase (I) and quadrature (Q) signals based on the selected signal from the plurality of signals.

22. The method of claim 16, wherein frequency dividing the first oscillating signal to generate the first frequency-divided signal comprises generating in-phase (I) and quadrature (Q) signals, wherein generating the at least one LO signal comprises:
generating a first plurality of signals having different phases based on the I signal;
generating a second plurality of signals having different phases based on the Q signal;
selecting a first signal of the first plurality of signals based on the phase error, the first signal being an in-phase LO signal; and
selecting a second signal of the second plurality of signals based on the phase error, the second signal being a quadrature LO signal.

23. The method of claim 16, wherein frequency dividing the first oscillating signal to generate the first frequency-divided signal comprises:
frequency dividing the first oscillating signal by a factor M to generate a first plurality of signals having different phases; and
frequency dividing at least one of the first plurality of signals by a factor L to generate a second plurality of signals having different phases.

24. The method of claim 23, wherein:
the first plurality of signals comprises 2×M number of signals;
the second plurality of signals comprises 2×L number of signals; and
the generation of the at least one LO signal further comprises:
generating a third plurality of signals comprising 2×M×L number of signals based on the first and second pluralities of signals; and
selecting two signals from the first and second pluralities of signals, the two signals being in-phase (I) and quadrature (Q) LO signals.

25. The method of claim 24, wherein a product of the divide ratios M and L is equal to $2^n$, n being an integer.

26. The method of claim 23, wherein:
the first plurality of signals comprises M number of signals;
the second plurality of signals comprises L number of signals; and
the generation of the at least one LO signal further comprises:
generating a third plurality of signals comprising M×L number of signals based on the first and second pluralities of signals; and
selecting a signal from the third plurality of signals; and
generating in-phase (I) and quadrature (Q) LO signals based on the selected signal.

27. An apparatus for phase adjustment, comprising:
means for frequency dividing an oscillating signal to generate a frequency-divided signal;
means for frequency dividing the oscillating signal to generate a phase-locked loop (PLL) feedback signal, wherein the oscillating signal is generated based on the PLL feedback signal;
means for detecting a phase error associated with at least one local oscillator (LO) signal; and
means for adjusting a phase of the frequency-divided signal based on the phase error to generate the at least one LO signal.

* * * * *